United States Patent [19]

Mori et al.

[11] Patent Number: 4,970,569

[45] Date of Patent: Nov. 13, 1990

[54] NICKEL BASED MATERIAL FOR A SEMICONDUCTOR APPARATUS

[75] Inventors: Toshihiko Mori; Kenji Kubosono, both of Sagamihara, Japan

[73] Assignee: Mitsubishi Denki Kabushiki Kaisha, Japan

[21] Appl. No.: 346,289

[22] Filed: May 1, 1989

Related U.S. Application Data

[63] Continuation of Ser. No. 52,401, May 21, 1987, abandoned.

[30] Foreign Application Priority Data

May 23, 1986 [JP] Japan ................................ 61-118607
May 23, 1986 [JP] Japan ................................ 61-118608

[51] Int. Cl.$^5$ ...................... H01L 23/54; H01L 23/52
[52] U.S. Cl. ......................................... 357/67; 357/70
[58] Field of Search ............................ 357/70, 67, 74; 148/310, 442, 327, 159, 162; 428/134, 653, 654, 619, 680, 681; 420/448, 452, 453, 538, 547; 427/88, 89, 90

[56] References Cited

U.S. PATENT DOCUMENTS 3,217,401 11/1965 White ..................................... 357/67
4,498,121 2/1985 Breedis et al. ....................... 361/401
4,607,276 8/1986 Butt ....................................... 357/74

FOREIGN PATENT DOCUMENTS 2419157 6/1979 Fed. Rep. of Germany .
3312713 10/1984 Fed. Rep. of Germany .
205301 12/1983 German Democratic Rep. .

OTHER PUBLICATIONS

"Mitsubishi Metal Products Catalog", Mitsubishi Denki Kabushiki Kaisha, Catalog Number P-C20-00-AsA8512, Dec. 1985.
Betteridge, W., "Nickel and Its Alloys", Chichester, England, Ellis Horwood Ltd., 1984, pp. 63, 64.

Primary Examiner—Rolf Hille
Assistant Examiner—S. V. Clark
Attorney, Agent, or Firm—Leydig, Voit & Mayer

[57] ABSTRACT

A nickel based material for a semiconductor apparatus is provided which includes between 0.5 and 5% of at least one material selected from the group consisting of cobalt, iron, aluminum, manganese, silicon, carbon, and copper; residual nickel; and unavoidable impurities. With this nickel based material, electrical conductivity thereof can be maintained within a proper value and the plate film adhesion in silver plating nickel based products can be improved remarkably and both heat dissipation capacity and the coefficient of thermal expansion can be improved.

9 Claims, No Drawings

NICKEL BASED MATERIAL FOR A SEMICONDUCTOR APPARATUS

This application is a continuation of patent application Ser. No. 7/052,401, filed May 21, 1987 now abandoned.

BACKGROUND OF THE INVENTION

This invention relates to a nickel based material for a semiconductor apparatus.

In the past, as a lead frame material for a semiconductor apparatus, an alloy with the common name "42 alloy" in which a principal component thereof is Fe-Ni having a composition of Fe 42% Ni and a copper alloy containing copper as a principal component have been used. The main properties required of a lead frame material are as follows: (i) a small coefficient of thermal expansion which is close to that of a silicon chip; (ii) superior heat dissipation capacity; (iii) high strength; (iv) superior workability; (v) superior corrosion resistance; and (vi) superior heat resistance. With regard to the above property (i), this is for preventing a silicon chip from cracking by stress therein which is caused by the difference in thermal expansion while heating at a die bonding process, in which the silicon chip which forms an electrical circuit is placed on the lead frame material. The above property (ii) is for preventing trouble in an integrated circuit (IC) arising from the self-exotherm of the IC during operation. And the above properties (iii) to (vi) are also both required for ever IC from a practical point.

The first reason why the above 42 alloy has been used in the main is that among the above required properties the coefficient of thermal expansion thereof is particularly small. Also, the 42 alloy is easy to compose during massproduction. Moreover, the 42 alloy has many merits, namely, the strength and workability thereof are superior, corrosion resistance and heat resistance are high, and adhesion to plastic packing is superior. However, the 42 alloy has defects in that it is costly and heat dissipation capacity thereof is inferior.

Therefore, copper alloys have been noted in recent years instead of the 42 alloy for their low cost and in that the copper alloy is a raw material having high electrical conductivity which will decrease the exotherm of the IC itself accompanied by an increased integration. The required properties of the copper alloy are approaching that of the 42 alloy within possible limits, however, the coefficient of thermal expansion, which is one of the most important properties, is large. This large coefficient of thermal expansion of the copper alloy must be compensated by IC production packaging techniques.

SUMMARY OF THE INVENTION

Accordingly, an object of the present invention is to provide a nickel based material for a semiconductor apparatus which solves the above problems, that is the inferior heat dissipation capacity which is the most serious problem of the 42 alloy and the large coefficient of thermal expansion which is the most serious problem of the copper alloy.

In order to achieve the above object, according to the present invention, there is provided a nickel based material for a semiconductor apparatus comprising 99.5% by weight or more of nickel and residual unavoidable impurities.

The nickel based material according to the present invention exhibits properties which resemble those of nickel metal itself. By utilizing the nickel based material as a lead frame material for a semiconductor apparatus, surprisingly excellent results can be obtained. Both the above-mentioned small heat dissipation capacity, which is a defect of the 42 alloy and the large coefficient of thermal expansion, which is a defect of the copper alloy can be improved by the present invention. Therefore, the industrial value of the present material is great.

According to another aspect of the present invention, there is provided a nickel based material for a semiconductor apparatus comprising at least one material selected from the group consisting of cobalt, iron, aluminum, manganese, silicon, carbon, and copper; residual nickel; and unavoidable impurities.

Nickel metal itself has superior heat conductivity, and the coefficient of thermal expansion thereof is a value intermediate those of the 42 alloy and copper alloy. By adding 0.05 to 5% by weight of the total amount selected from the above group to nickel according to the present invention, the electrical conductivity of the nickel based material can be maintained at 10% IACS or more, while at the same time, heat resistance thereof can be improved. On the other hand, if the total amount added is less than 0.05% or more than 5%, the above-noted effect can not be obtained. In addition, by decreasing oxygen content of the nickel based products to 50 ppm or less, the plating film adhesion in silver plating nickel based products can be improved remarkably.

The elements added to the present composition in a total amount of between 0.05 to 5% are present in the following concentrations by weight:
no more than 2% Co,
no more than 0.1% C,
no more than 0.5% Fe,
no more than 0.2% Si,
no more than 0.5% Al, and
no more than 0.5% Mn.
This group may also include no more than 2.5% Cu.

DESCRIPTION OF THE PREFERRED EMBODIMENTS

Nickel based materials according to the present invention were prepared by a conventional method and each type of prior material used as lead frame material for ICs were also prepared. Compositions and properties of the nickel based materials and prior materials are compared in Tables 1 and 2. Properties of the products or strips which were prepared by using the nickel based materials and the prior materials are compared in Table 3.

TABLE 1

| | composition (wt %) | tensile strength (Kgf/mm$^2$) *1 | stretch (%) *2 | heat resistance temperature (°C.) *3 |
| --- | --- | --- | --- | --- |
| 42 alloy | Ni: 42 Fe: Bal | 65 | 10 | 650 |
| CDA C19400 | Fe: 2.4 Zn: 0.12 Cu: Bal | 45 | 4 | 430 |

TABLE 1-continued

|  | composition (wt %) | tensile strength (Kgf/mm²) *1 | stretch (%) *2 | heat resistance temperature (°C.) *3 |
|---|---|---|---|---|
| Example 1 | Co: 0.12 C: 0.03 Fe: 0.01 Ni: Bal O₂: 15 ppm | 65 | 12 | 420 |
| Example 2 | Co: 1.62 C: 0.06 Fe: 0.17 Ni: Bal O₂: 20 ppm | 67 | 12 | 470 |
| Example 3 | Co: 0.01 C: 0.03 Fe: 0.42 Si: 0.06 Ni: Bal O₂: 18 ppm | 64 | 13 | 440 |
| Example 4 | Co: 0.02 C: 0.01 Fe: 0.03 Al: 0.32 Ni: Bal O₂: 23 ppm | 64 | 14 | 430 |
| Example 5 | Co: 0.01 C: 0.02 Fe: 0.03 Si: 0.15 Mn: 0.08 Ni: Bal O₂: 12 ppm | 62 | 16 | 440 |
| Example 6 | Co: 0.03 C: 0.01 Fe: 0.02 Si: 0.02 Cu: 2.33 Mn: 0.01 Ni: Bal O₂: 16 ppm | 63 | 15 | 420 |
| Example 7 | Co: 1.23 C: 0.06 Fe: 0.06 Si: 0.02 Cu: 1.62 Mn: 0.03 Ni: Bal O₂: 18 ppm | 66 | 13 | 460 |
| Comparative Example 1 | Co: 0.18 C: 0.01 Fe: 0.01 Ni: Bal O₂: 75 ppm | 64 | 14 | 420 |
| Comparative Example 2 | Co: 0.73 C: 0.02 Fe: 0.03 Si: 0.01 Cu: 0.12 Ni: Bal O₂: 68 ppm | 65 | 14 | 440 |

*1 and *2: at 37% workability, *3: temperature at which strength drops 10% from initial value after heating for 5 minutes.

TABLE 2

|  | coefficient of thermal expansion ($\times 10^{-6}$/°C.) | heat conductivity (Cal/cm²/cm/sec/°C.) | electrical conductivity (% IACS) | existence of blistering *4 |
|---|---|---|---|---|
| 42 alloy | 7.0 | 0.036 | 3 | none |
| CDA C19400 | 16.8 | 0.63 | 65 | none |
| Example 1 | 13.1 | 0.22 | 26 | none |
| Example 2 | 13.4 | 0.17 | 15 | none |
| Example 3 | 13.3 | 0.18 | 18 | none |
| Example 4 | 13.2 | 0.15 | 14 | none |
| Example 5 | 13.0 | 0.17 | 16 | none |
| Example 6 | 13.5 | 0.14 | 13 | none |
| Example 7 | 13.2 | 0.11 | 11 | none |
| Comparative Example 1 | 13.2 | 0.22 | 26 | yes |
| Comparative Example 2 | 13.2 | 0.15 | 14 | yes |

*4: blistering of plating portion by heating 450° C., 5 minutes after plating with silver.

TABLE 3

| properties | 42 alloy | CDA C19400 | Example 1 | Example 3 | Example 4 | Example 7 |
|---|---|---|---|---|---|---|
| lead frame deformation amount (mm) *5 | 0.7 | 1.7 | 0.75 | 0.75 | 0.75 | 0.7 |
| exothermic temperature on bipolar linear IC (°C., at 1 watt power) | 150 | 85 | 100 | 105 | 110 | 115 |
| repetition of bending lead frame | 8.4 | 4.5 | 5.5 | 5.8 | 5.8 | 6.0 |

*5: where 16 lead DIP type IC is dropped over 600 mm at incline angle of 84.5°.

As is clear from Tables 1 and 2, the heat conductivity and coefficient of thermal expansion for each of Examples 1 to 7 according to the present invention were values intermediate those of the 42 alloy and the copper alloy (CDA C19400). In addition, electrical conductivity of each nickel based alloy sample of Examples; 1 to 7 were much improved compared with the 42 alloy. Therefore, it is clear that the nickel based materials according to the present invention possess appropriate properties as lead frame materials for a semiconductor apparatus.

In the future production of ICs, technological innovations are expected where chips and lead frame materials for an IC will be wire bonded directly without silver plating for the purpose of reducing production costs. Nickel based materials are considered to be useful material because their spot welding properties are naturally superior. Therefore, if a lead frame is manufactured by using the nickel based alloy according to the present invention, chips and lead frames can be wire bonded directly without silver plating.

The nickel based alloy samples of the examples were heated after plating with silver, however, blistering did not arise. On the other hand, in the nickel based alloys according to the Comparative Examples 1 and 2, blistering arose by heating after plating with silver.

From the results shown in Table 3, resistance to deformation of the lead frame is improved by using the nickel based materials according to the present invention compared with the prior materials, namely, deformation resistance of the lead frame of the nickel based materials is superior to that of C19400. Moreover, it is understood that the exothermic properties of the nickel based materials according to the present invention are close to those of copper type materials judging from the obtained data.

In addition, heat resistance and oxidation resistance of the nickel based material according to the present invention are superior, and the adherent property thereof to a sealing resin such as a plastic package can also be improved. Accordingly, the hygroscopicity of the IC can be decreased and reliability thereof can be improved compared to prior copper alloy materials.

What is claimed is:

1. A nickel-based material for use as a lead frame material or wire board material for integrated semiconductor circuits comprising between 0.5 and 5% by weight of at least one substance from the group consisting of cobalt, iron, aluminum, manganese, silicon, carbon, and copper; residual nickel; and unavoidable impurities, wherein the oxygen content of the nickel material is no more than 50 ppm.

2. The nickel-based material according to claim 1 wherein the nickel-based material has a composition comprising:
   0 to 2% by weight cobalt,
   0 to 0.1% by weight carbon,
   0 to 0.2% by weight silicon,
   0 to 0.5% by weight iron,
   0 to 0.5% by weight manganese,
   0 to 0.5% by weight aluminum,
   0 to 2.5% by weight copper,
   residual nickel and unavoidable impurities.

3. The nickel-based material according to claim 2 wherein the nickel-based material has the following composition:
   0.12% by weight cobalt,
   0.03% by weight carbon,
   0.01% by weight iron, residual nickel and unavoidable impurities and the oxygen content of the nickel material is 15 ppm.

4. The nickel-based material according to claim 2 wherein the nickel-based material has the following composition:
   1.6% by weight cobalt,
   0.06% by weight carbon,
   0.17% by weight iron,
   residual nickel and unavoidable impurities and the oxygen content of he nickel material is 20 ppm.

5. The nickel-based material according to claim 2 wherein the nickel-based material has the following composition:
   0.01% by weight cobalt,
   0.03% by weight carbon,
   0.42% by weight iron,
   0.06% by weight silicon,
   residual nickel and unavoidable impurities and the oxygen content of the nickel material is 18 ppm.

6. The nickel-based material according to claim 2 wherein the nickel-based material has the following composition:
   0.02% by weight cobalt,
   0.02% by weight carbon,
   0.03% by weight iron,
   0.32% by weight aluminum,
   residual nickel and unavoidable impurities and the oxygen content of the nickel material is 23 ppm.

7. The nickel-based material according to claim 2 wherein the nickel-based material has the following composition:
   0.02% by weight cobalt,
   0.02% by weight carbon,
   0.08% by weight manganese,
   0.03% by weight iron,
   0.15% by weight silicon,
   residual nickel and unavoidable impurities and the oxygen content of the nickel material is 12 ppm.

8. The nickel-based material according to claim 2 wherein the nickel-based material has the following composition:
   0.03% by weight cobalt,
   0.01% by weight carbon,
   2.33% by weight copper,
   0.01% by weight manganese,
   0.02% by weight iron,
   0.02% by weight silicon,
   residual nickel and unavoidable impurities and the oxygen content of the nickel material is 16 ppm.

9. The nickel-based material according to claim 2 wherein the nickel-based material has the following composition:
   1.23% by weight cobalt,
   0.06% by weight carbon,
   1.62% by weight copper,
   0.03% by weight manganese,
   0.06% by weight iron,
   0.02% by weight silicon,
   residual nickel and unavoidable impurities and the oxygen content of the nickel material is 18 ppm.

* * * * *

UNITED STATES PATENT AND TRADEMARK OFFICE
CERTIFICATE OF CORRECTION

PATENT NO. : 4,970,569

DATED : November 13, 1990

INVENTOR(S) : Mori et al.

It is certified that error appears in the above-identified patent and that said Letters Patent is hereby corrected as shown below:

In item [57] Abstract, line 8, change "plate" to --plating--.

Column 5, line 46, change "1.6%" to --1.62%--.

Column 6, line 14, change "0.02%" to --0.01%--;
         line 22, change "0.02%" to --0.01%--.

Signed and Sealed this

Twenty-first Day of July, 1992

Attest:

DOUGLAS B. COMER

*Attesting Officer*  *Acting Commissioner of Patents and Trademarks*